United States Patent [19]

Jin et al.

[11] Patent Number: 5,183,772
[45] Date of Patent: Feb. 2, 1993

[54] MANUFACTURING METHOD FOR A DRAM CELL

[75] Inventors: Dae-je Jin; Kwang-byeog Seo, both of Seoul; Tae-young Jeong, Kyunggi, all of Rep. of Korea

[73] Assignee: Samsung Electronics Co., Ltd., Kyunggi, Rep. of Korea

[21] Appl. No.: 824,885

[22] Filed: Jan. 22, 1992

Related U.S. Application Data

[63] Continuation of Ser. No. 489,819, Mar. 9, 1990.

[30] Foreign Application Priority Data

May 10, 1989 [KR] Rep. of Korea ............. 89-6207[U]

[51] Int. Cl.$^5$ ........................................ H01L 21/70
[52] U.S. Cl. ........................... 437/52; 437/47; 437/48; 437/60; 437/228; 437/233; 437/235; 437/919
[58] Field of Search ............... 437/47, 48, 52, 60, 437/228, 233, 235, 238, 919; 357/23.6; 365/149

[56] References Cited

U.S. PATENT DOCUMENTS

| | | | |
|---|---|---|---|
| 4,536,947 | 8/1985 | Bohr et al. | 437/919 |
| 4,603,059 | 7/1986 | Kiyosumi et al. | 437/919 |
| 4,672,410 | 6/1987 | Miura et al. | 357/23.11 |
| 4,794,563 | 12/1988 | Maeda | 357/23.6 |
| 4,899,203 | 2/1990 | Ino | 35/23.6 |
| 4,907,046 | 3/1990 | Ohji et al. | 357/51 |

FOREIGN PATENT DOCUMENTS

| | | | |
|---|---|---|---|
| 0184548 | 10/1984 | Japan | 437/235 |
| 0097664 | 8/1985 | Japan | 357/236 |
| 0256652 | 11/1986 | Japan | 437/228 |
| 0030337 | 2/1987 | Japan | 437/235 |
| 0243342 | 10/1987 | Japan | 437/981 |
| 0258024 | 10/1988 | Japan | 437/228 |

OTHER PUBLICATIONS

Koyamagi et al. A 5-V only 16 k-bit stacked-capacitor MOS RAM.
Watanabe, "Stacked capacitor cells for high-density dynamic RAMS", IEDM 1988 pp.-600-603.
Ghate, "Interconnections in VLSI" Physics Today Oct. 1986 pp. 58-66.

*Primary Examiner*—Tom Thomas
*Attorney, Agent, or Firm*—Cushman, Darby & Cushman

[57] ABSTRACT

A manufacturing method for a DRAM cell provided with a stacked capacitor is disclosed. The method including: (1) defining a switching transistor region by forming a field oxide layer upon a first conduction type semiconductor substrate; (2) forming source and drain regions of a second conduction type; (3) forming respective first conductive layers on a part of said field oxide layer and on a gate oxide layer over a channel region within the switching transistor region; and forming a first insulating layer; (4) forming a second conductive layer and removing parts of the second conductive layer which are over the channel region and the drain region; (5) forming an opening for exposing a part of the source region; (6) forming a third conductive layer on the substrate and overlapping the remaining portions of the second conductive layer, to provide a portion thereof having a saddle structure providing a gentle slope; (7) etching to remove portions of the second and third conductive layers; (8) forming a dielectric layer; and (9) forming a fourth conductive layer.

20 Claims, 4 Drawing Sheets

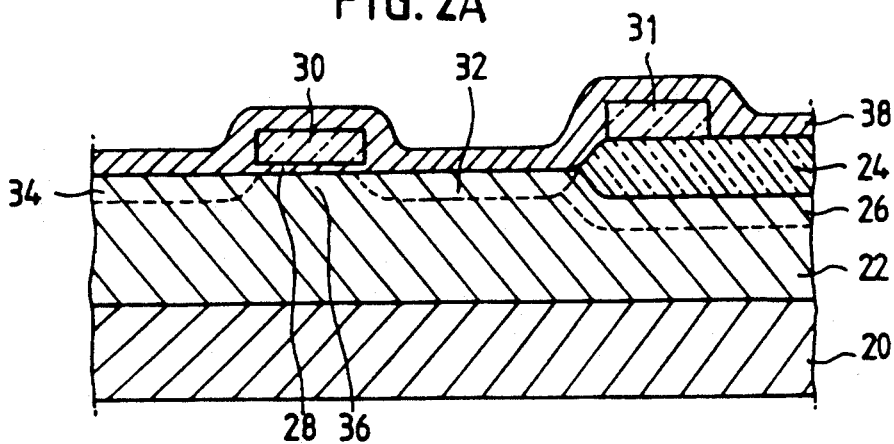
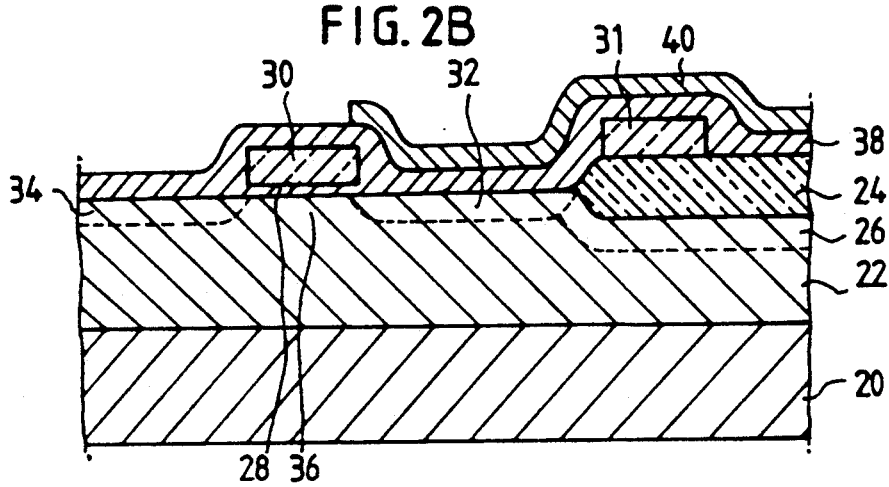
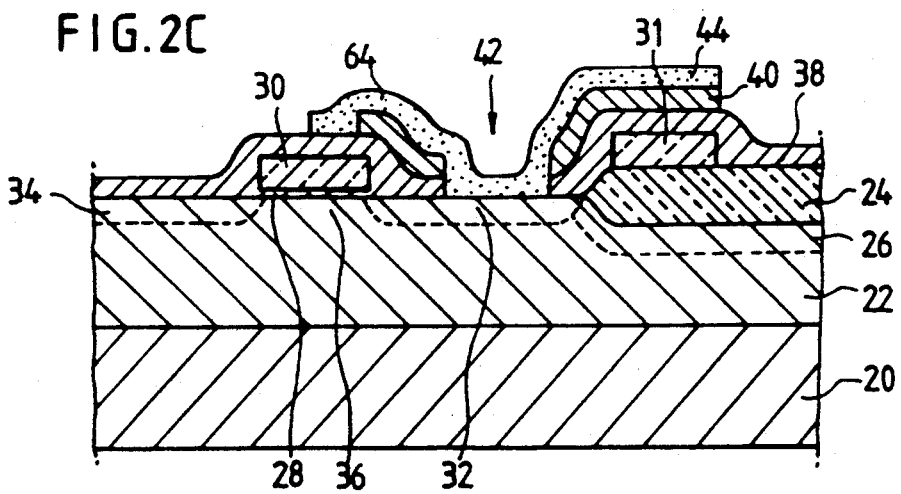

MANUFACTURING METHOD FOR A DRAM CELL

This is a continuation of application Ser. No. 07/489,819, filed on Mar. 9, 1990.

FIELD OF THE INVENTION

The present invention relates to a manufacturing method for a DRAM cell, and particularly to a manufacturing method for a stacked storage capacitor type DRAM cell.

BACKGROUND OF THE INVENTION

A DRAM cell consists of a transistor with a drain-source passage connected between a bit line and a cell node and a storage capacitor connected between the above mentioned cell node and a cell plate. Accordingly, as the density of memory cells are increased, DRAM cells having three-dimensional capacitors with trench and stack structures have been developed in order to maximize the capacitances of the storage capacitors within the limited area of the DRAM cells. A trench type storage capacitor is formed in a groove of a semiconductor substrate, while a stacked type storage capacitor is formed upon a semiconductor substrate.

The trench capacitor type DRAM cells are advantageous because they permit topological flattening and sufficient capacitance in a high density DRAM. But they are weak in protecting against α particles due to soft errors, and have further problems such as punch-through and leakage between the trenches. On the other hand, the stacked capacitor type DRAM cells are relatively simple in their manufacturing process and provide strong protection against soft errors because of their small diffusion areas. But they do however have drawbacks such as significant topological differences due to the fact that the capacitors are stacked upon the transistors.

FIG. 1 is a vertical section view of a convention stacked capacitor type DRAM cell. This type of DRAM cell will be briefly described below.

A P type well 2 is formed upon a P type substrate 1. A field oxide layer 4 is formed to isolate or separate the memory cells of the DRAM. A P+ channel stopper layer 3 is formed under the field oxide layer 4. Thereafter, a gate oxide layer 5 is formed, and upon this gate oxide layer 5, an N+ impurity doped polycrystalline silicon layer 6 is formed which serves as the gate electrode of a switching transistor. At the same time, another polycrystalline silicon layer 7 is formed which serves as the gate electrode of a memory cell which is disposed adjacent to the field oxide layer 4.

Next the N+ drain region 9 and N. source region 8 of the switching transistor are formed. Then, an insulating layer 10 for electrically insulating the polycrystalline layers 6, 7, and a polycrystalline layer 11 used as a storage node, are formed. A selected portion of the source region 8 is exposed. Thereafter, an N+ doped thin polycrystalline silicon layer 12 which serves as an electrode of the capacitor is formed so that it contacts the exposed portion of the source region 8. Then, a dielectric layer 13 of the storage capacitor is formed upon the surface of the thin polycrystalline silicon layer 12. Another N+ doped polycrystalline silicon layer 14 which serves as another electrode of the storage capacitor is formed.

An insulating layer 15 and a flattening layer 16 are formed upon the polycrystalline silicon layer 14. A conductive layer 17 contacting the drain region 9 and which serves as a bit line is formed upon the flattening layer 16.

The above structure is described in Pages 600 through 603 of IEDM (International Electron Devices Meeting), 1988, under the heading "Stacked Capacitor Cells for High-density Dynamic RAMs".

The above described conventional stacked capacitor cell makes it possible to obtain sufficient capacitance from the limited occupation area of the memory cell. However, due to the thickness of the polycrystalline silicon layer which is used as an electrode of the capacitor, the topological variation of the device diminishes the workability of subsequent process steps.

SUMMARY OF THE INVENTION

Therefore, it is the object of the present invention to provide a manufacturing method for a DRAM cell, in which sufficient capacitance is obtained in a high density DRAM, while maintaining the topological profile of the device.

In achieving the above object, the manufacturing method according to the present invention comprises the following steps:

defining a switching transistor region by forming a field oxide layer upon a first conduction type semiconductor substrate;

forming source and drain regions of a second conduction type different from the first conduction type in the switching transistor region;

forming respective first conductive layers on a part of the field oxide layer and on a gate oxide layer over a channel region within said switching transistor region; and forming a first insulating layer on the first conductive layers and on the surface of the substrate;

forming a second conductive layer on the whole surface of the first insulating layer, and then, removing portions of the second conductive layer which are formed over the channel region and the drain region;

forming an opening for exposing a part of the source region;

forming a third conductive layer over remaining portions of the second conductive layer and over parts of the substrate, to provide a gentle slope from an edge of overlap of the second conductive layer and the third conductive layer to a region immediately adjacent that edge and above the first conductive layer over the channel region;

etching to remove portions of the second and third conductive layers;

forming a dielectric layer over remaining portions of the third conductive layer to serve as a dielectric medium of the capacitor; and forming a fourth conductive layer on both the first insulating layer and the dielectric layer.

BRIEF DESCRIPTION OF THE DRAWINGS

The above object and other advantages of the present invention will become more fully apparent by the following description of the preferred embodiment of the present invention with reference to the attached drawings in which:

FIGS. 2A to 2E are sectional views showing the manufacturing process for a DRAM cell having a stacked capacitor according to a preferred embodiment of the present invention.

DESCRIPTION OF THE PREFERRED EMBODIMENT

Figure 1:
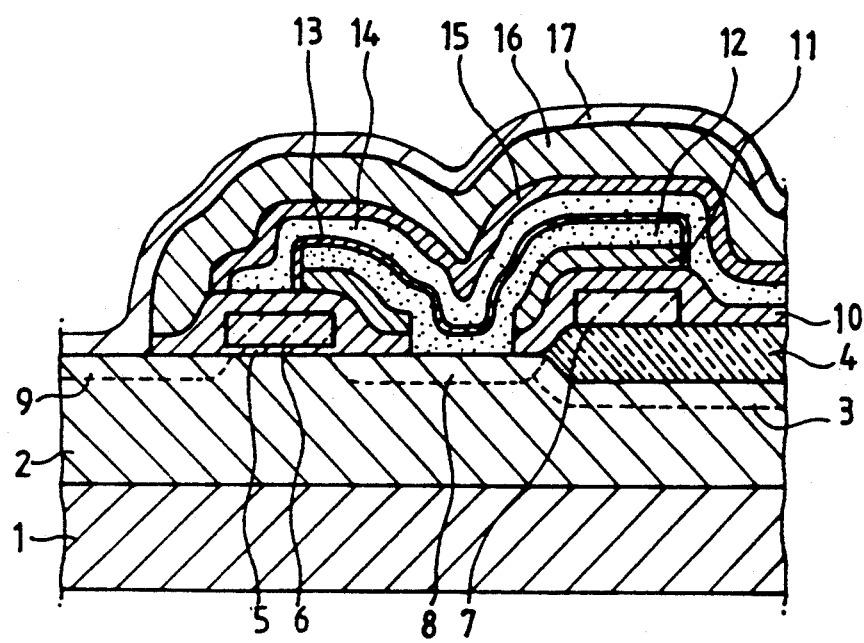
FIG. 1 is a sectional view of a DRAM cell provided with a conventional stacked capacitor.

FIGS. 2A to 2E are sectional views showing the manufacturing process for a DRAM cell having a stacked capacitor in accordance with the preferred embodiment of a present invention.

Referring to FIG. 2A, a P type well region 22 having an ion concentration of $10^{16}$ ions/cm$^3$ and a depth of 4 $\mu$m is formed on a P type substrate 20. The P type well has a resistivity of 5–18 $\Omega$-cm and directions of $<100>$. A thick field oxide layer 24 is formed by the LOCOS (local oxidation of silicon) method in accordance with conventional N channel MOS transistor manufacturing methods. A P+ channel stopper layer 26 is formed under the field oxide layer 24. Thereafter, a gate oxide layer 28 is formed with a thickness of 100–200 Å on the surface of the well region 22. The gate oxide layer 28 is disposed in a switching transistor region which is in turn disposed adjacent to the field oxide layer 24. On the gate oxide layer 28 is formed a first conductive layer, e.g., a polycrystalline silicon layer 30 doped with an N type impurity which serves as the gate electrode of the switching transistor. The gate oxide layer has a thickness of 2000–3000 Å. Another first polycrystalline silicon layer 31 doped with an N type impurity is simultaneously formed adjacent to a relevant portion of the field oxide layer 24. This layer 31 serves as a gate electrode of the memory cell. The surface of the substrate located under the first polycrystalline silicon layer 30 formed within the switching transistor region becomes a channel region 36.

Thereafter, N+ doped source and drain regions 32, 34 are formed through the use of an ion implantation method, and then, on the whole surface of the above-described structure, a first insulating layer 38 is formed with a thickness of 1000–2000 Å. The first insulating layer 38 is formed of a LTO (Low Temperature Oxide) layer or a HTO (High Temperature Oxide) layer based on a chemical vapor deposition method.

The above-described manufacturing process for a MOS transistor has been known in this technical field, and it is noted that the above-described N channel MOS transistor can be directly formed on a P type substrate.

Then, as shown in FIG. 2B, a second conductive layer, e.g., a polycrystalline silicon layer 40 doped with an N+ type impurity is formed with a thickness of 1000–3000 Å on the first insulating layer 38. This layer 40 serves as a storage node of the capacitor. Portions of the second polycrystalline layer 40 which are over the first polycrystalline silicon layer 30 and the drain region 34 are thereafter removed.

With reference to FIG. 2C, an opening 42 is formed at a relevant position over the source region 32 based on a known photo etching method. Then, a third conductive layer, e.g., an N+ doped third polycrystalline silicon layer 44 which serves as the first electrode of the capacitor is formed on the whole surface of the above-described structure in such a manner that the layer 44 contacts the exposed source region 32. Here, a portion 64, from a region of overlap between the sheared portion of the second polycrystalline silicon layer 40 and the third polycrystalline silicon layer 44 to parts over the first polycrystalline silicon layer 30, forms a saddle structure providing a gentle slope.

Thereafter, the portion of the third polycrystalline silicon layer 44 formed over the drain region 34 and upon portions other than that which is overlapped with the first polycrystalline silicon layer 30 is removed. The second and third polycrystalline silicon layers 40, 44 formed over the field oxide layer 24 remain mostly overlapped with the first polycrystalline silicon layer 31 formed on the field oxide layer 24. The remaining portions are removed.

Figure 2D:
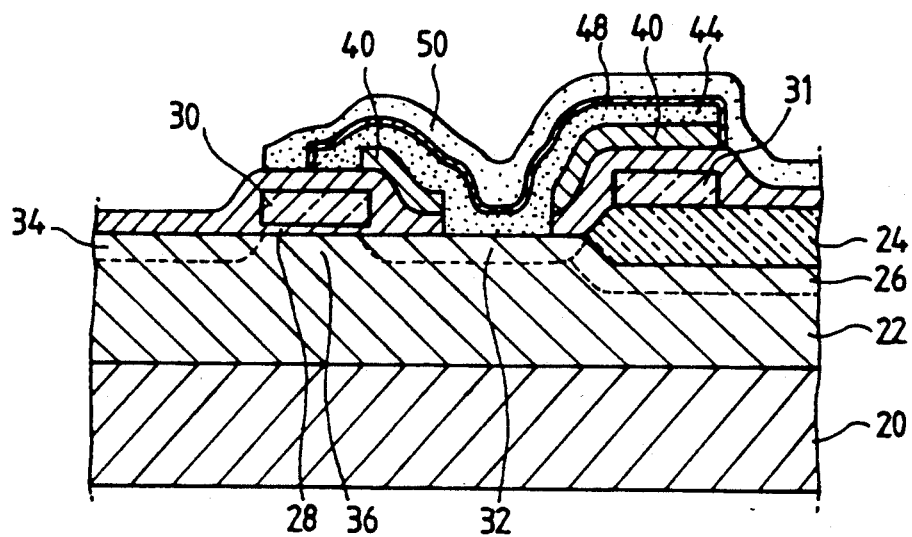

As shown in FIG. 2D, a dielectric layer 48 is formed with a thickness of about 60 Å on the whole surface of the second and third polycrystalline silicon layers 40, 44. This dielectric layer 48 serves as a dielectric medium of the capacitor, and in this preferred embodiment is composed of an ONO ($SiO_2$—$Si_3N_4$—$SiO_2$) layer.

Thereafter, a fourth conductive layer, e.g., an N+ doped fourth polycrystalline silicon layer 50 is formed with a thickness of 1000–2000 Å on the surfaces of the exposed first insulating layer 38 and the dielectric layer 48, in such a manner that the layer 50 serves as a second electrode layer of the capacitor. Here, the fourth polycrystalline silicon layer 50 forms a gentle slope on the portion 64 where the saddle structure is formed.

Figure 2E:
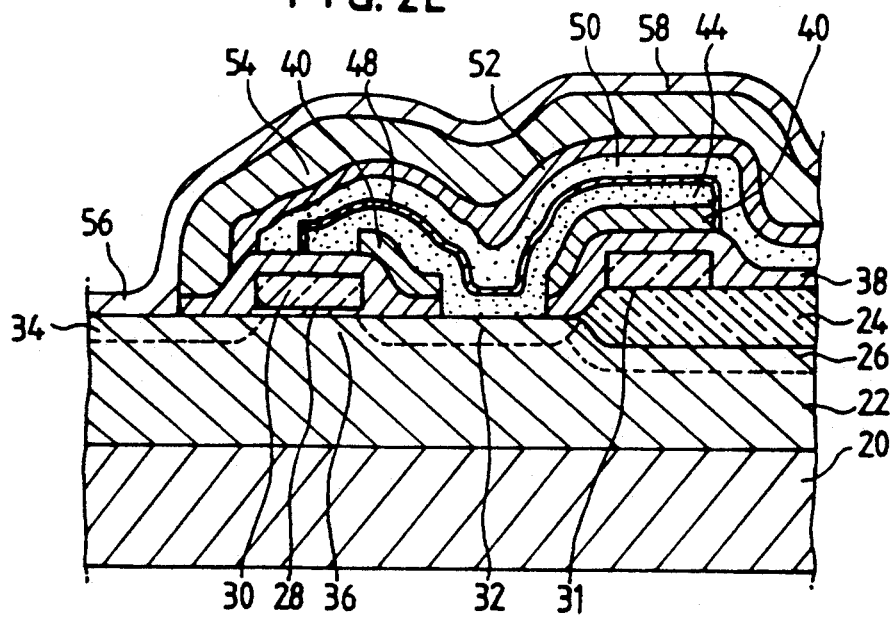

As shown in FIG. 2E, a second insulating layer 52 is formed with a thickness of about 500–2000 Å on the surface of the fourth polycrystalline silicon layer 50 through an oxidation process. Thereafter, a flattening layer 54 is formed with a thickness of 3000–5000 Å upon the second insulating layer 52. This flattening layer 54 may consist of a BPSG (boro-phospho silicate glass) layer or a PSG (phospho silicate glass) layer.

A window is formed on the drain region 34 through a photo etching method. A metal silicide layer 58 is selectively formed in such a manner that it contacts with the drain region 34 through the window. The metal silicide layer 58 may be a W or Ti silicide, and is used as a bit line.

Figure 3A:
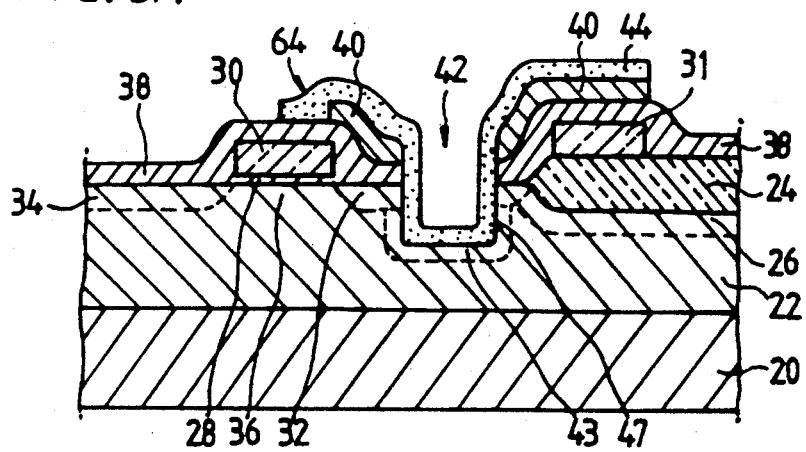
FIGS. 3A to 3C are sectional views showing the manufacturing process for another DRAM cell having a stacked capacitor according to another preferred embodiment of the present invention.
Figure 3B:
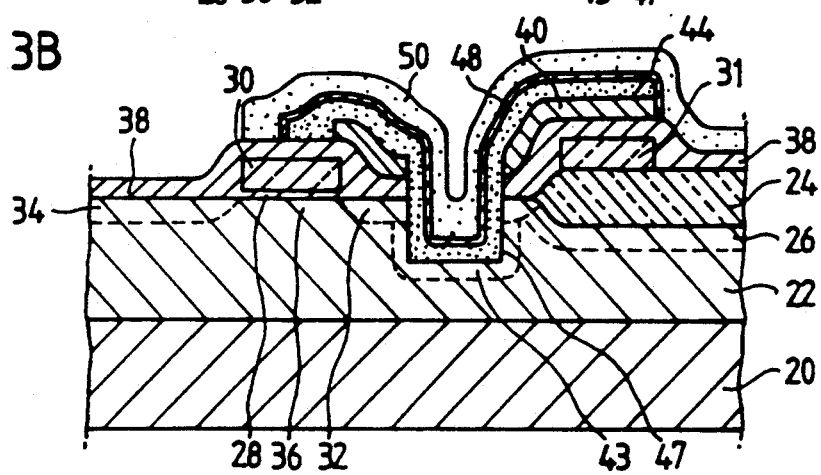
Figure 3C:
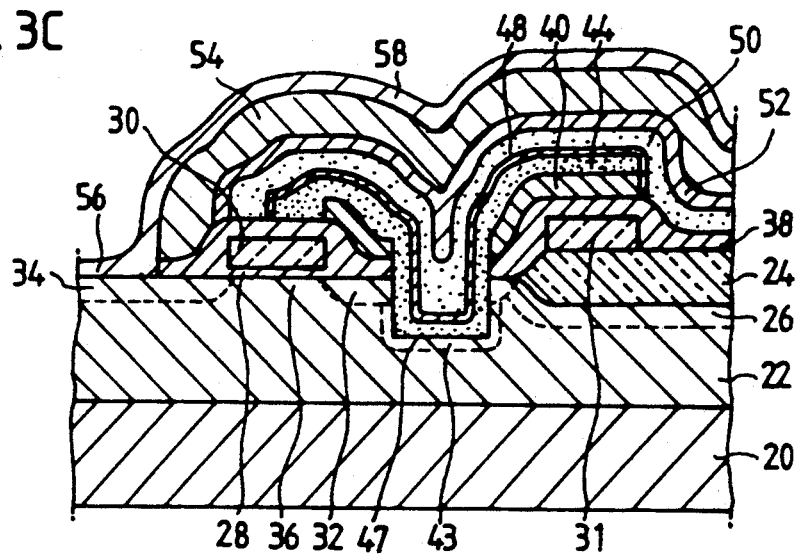

FIGS. 3A to 3C are sectional views illustrating another embodiment of the present invention, and the parts which are the same as those of FIGS. 2A to 2E will be accorded with the same reference number. The steps preceding that of FIG. 3A are the same as the steps of FIGS. 2A to 2B.

Referring to FIG. 3A, an opening 42 is formed on the relevant portion of the source region 36 through the use of a photo etching method. A P type impurity such as boron is ion-implanted with an ion concentration of $6 \times 10^{12}$ ions/cm$^2$ and with an energy of 160 KeV into the exposed source region 36. Thus an ion implantation region is formed under the source region 36. Thereupon, a trench 62 is formed to a depth of 0.3–2 $\mu$m through the opening 42. Then, a P type impurity such as boron is ion-implanted with an ion concentration of $2 \times 10^{12}$ ions/cm$^2$ and with an energy of 40 KeV into the bottom of the trench 62. Then the P type impurity is diffused into the sides and bottom of the trench 62 to form a P+ type region 43. This P+ type region 43 prevents punch-through between the trenches. Then, an N+ doped third polycrystalline layer 44 is deposited with a thickness of 500–2000 Å on the whole surface of the above-described structure, so that the layer 44 serves as a first electrode of the capacitor. Here, a portion 64 from a region of overlap between a sheared portion of the second polycrystalline silicon layer 40 and the third polycrystalline silicon layer 44 to parts over the first polycrystalline silicon layer 30 forms a saddle structure providing a gentle slope.

Thereafter, the portion of the third polycrystalline layer 44 which is formed on the drain region and on the portions other than the required portion overlapping the first polycrystalline silicon layer 30 is removed. Here, the second and third polycrystalline silicon layers 40, 44 which are formed on the field oxide layer 24 remain mostly overlapped with the first polycrystalline silicon layer 31. The remaining portions are removed.

As shown in FIG. 3B, a dielectric layer 48 is formed with a thickness of about 60 Å on the whole surfaces of the second and third polycrystalline silicon layers 40, 44. This dielectric layer 48 may consist of an ONO layer, and is made to serve as the dielectric medium of the capacitor. Thereafter, an N+ doped fourth polycrystalline silicon layer 50 is selectively formed with a thickness of 1000–2000 Å on the surfaces of the first insulating layer 38 and the dielectric layer 48.

The fourth polycrystalline silicon layer 50 forms a gentle slope on the portion 64 where a saddle structure is formed.

As shown in FIG. 3C, a second insulating layer 52 is formed with a thickness of about 1000 Å on the surface of the fourth polycrystalline silicon layer 50 through an oxidation process. Thereafter, a flattening layer 54 is formed with a thickness of 3000–5000 Å on the second insulating layer. The flattening layer 54 may consist of a BPSG layer or a PSG layer.

Then, an window is formed over the drain region 34 through a photo etching process. A metal silicide layer 58 is selectively formed in such a manner that the layer 58 contacts the drain region 34 which is exposed through the window. The metal silicide may consist of a W or Ti silicide, and is used as a bit line.

As described above, a portion where the second polycrystalline silicon layer and the third polycrystalline silicon layer overlap each other over the switching transistor region is formed which provides a gentle slope. Consequently, the remaining processes steps become easy to carry out.

According to the present invention, a saddle structure is utilized in such a manner that the bit line should be in contact with the drain with a gentle slope, so that the remaining processes become easy to carry out.

What is claimed is:

1. A manufacturing method for a DRAM cell provided with a stacked capacitor, comprising:
    defining a switching transistor region by forming a field oxide layer on a first conduction type semiconductor substrate;
    forming source and drain regions of a second conduction type different from said first conduction type in said switching transistor region;
    forming respective first conductive layers on a part of said field oxide layer and on a gate oxide layer over a channel region within said switching transistor region;
    forming a first insulating layer on said first conductive layers and on the surface of said semiconductor substrate;
    forming a second conductive layer on the whole surface of said first insulating layer, and then, removing portion of said second conductive layer which are over said channel region and said drain region;
    forming an opening for exposing a part of said source region;
    forming a third conductive layer over remaining portions of said second conductive layer and over parts of said substrate, to provide a gentle slope at least from an edge of overlap of said second conductive layer and said third conductive layer to a region immediately adjacent that edge and above the first conductive layer over said channel region;
    etching to remove portions of said second and third conductive layers;
    forming a dielectric layer over remaining portions of said third conductive layer to serve as a dielectric medium of said capacitor; and
    forming a fourth conductive layer on both said first insulating layer and said dielectric layer.

2. The manufacturing method for a DRAM cell as claimed in claim 1, wherein said dielectric layer is composed of an oxide layer or an ONO layer.

3. The manufacturing method for a DRAM cell as claimed in claim 1, wherein said first, second, third and fourth conductive layers are composed of polycrystalline silicon doped with an impurity of said second conduction type.

4. The manufacturing method for a DRAM cell as claimed in claim 1, further including the steps of:
    forming a second insulating layer and a flattening layer upon said fourth conductive layer;
    forming an opening for exposing a part of said drain region, and
    forming a metal silicide layer on both said exposed drain region and on said flattening layer.

5. The manufacturing method for a DRAM cell as claimed in claim 4, wherein said metal silicide layer is composed of W or Ti silicide.

6. A manufacturing method for a DRAM cell provided with a stacked capacitor, comprising:
    defining a switching transistor region by forming a field oxide layer upon a first conduction type semiconductor substrate;
    forming respective first conductive layers on a part of said field oxide layer and on a gate oxide layer over a channel region within said switching transistor region;
    forming source and drain regions of a second conduction type different from the first conduction type in said switching transistor region;
    forming a first insulating layer on said first conductive layers and on the surface of said semiconductor substrate;
    forming a second conductive layer on the whole surface of said first insulating layer, and then, removing portions of said second conductive layer which are over said channel region and said drain region;
    forming an opening for exposing a part of said source region and a trench within said semiconductor substrate;
    forming a third conductive layer over remaining portions of said second conductive layer and over parts of said substrate, to provide a gentle slope at least from an edge of overlap of said second conductive layer and said third conductive layer to a region immediately adjacent that edge and above the first conductive layer over said channel region;
    etching to remove portions of said second and third conductive layers;
    forming a dielectric layer over remaining portions of said third conductive layer to serve as a dielectric medium of said capacitor; and forming a fourth conductive layer on both said first insulating layer and said dielectric layer.

7. The manufacturing method for a DRAM cell as claimed in claim 6, wherein said dielectric layer is composed of an oxide layer or an ONO layer.

8. The manufacturing method for a DRAM cell as claimed in claim 6, wherein said first, second, third and fourth conductive layers are composed of polycrystalline silicon doped with an impurity of said second conduction type.

9. The manufacturing method for a DRAM cell as claimed in claim 6, further including the steps of:
forming a second insulating layer and a flattening layer upon said fourth conductive layer;
forming an opening for exposing a part of said drain region, and
forming a metal silicide layer on both said exposed drain region and on said flattening layer.

10. The manufacturing method for a DRAM cell as claimed in claim 9, wherein said metal silicide layer is composed of W or Ti silicide.

11. A manufacturing method for a DRAM cell provided with a stacked capacitor formed on a switching transistor having a gate electrode, drain region and source region formed in a semiconductor substrate having a surface, said method comprising the steps of:
forming a first insulating layer on said semiconductor substrate and over said gate electrode;
depositing a first conductive material on said first insulating layer and selectively etching the deposited conductive material layer to form a saddle pattern over said source region of said switching transistor, said saddle pattern having a middle portion extending over said source region and a saddle end portion ending at one side nearest said gate electrode;
forming a contact hole in said first conductive material through said middle portion of said saddle pattern to the surface of semiconductor substrate within the source region of said switching transistor;
depositing a second conductive material after forming said contact hole and selectively etching the deposited second conductive material layer to form a lower electrode pattern of said stacked capacitor, said second conductive material extending in said contact hole, over said saddle pattern, and beyond said saddle end portion of said saddle pattern;
coating a dielectric film of said stacked capacitor on the whole surface of the said second conductive material; and
depositing a third conductive material on said dielectric film to form an upper electrode layer of said stacked capacitor.

12. The manufacturing method for a DRAM cell as claimed in claim 11, wherein said dielectric film is composed of one of an oxide layer and an ONO layer.

13. The manufacturing method for a DRAM cell as claimed in claim 11, wherein said first, second and third conductive materials are composed of doped polycrystalline silicon.

14. The manufacturing method for a DRAM cell as claimed in claim 11, further including the steps of:

forming a second insulating layer and a flattening layer upon said upper electrode layer;
forming an opening for exposing a part of said drain region, and
forming a metal silicide layer on both said exposed drain region and on said flattening layer.

15. The manufacturing method for a DRAM cell as claimed in claim 14, wherein said metal silicide layer is composed of one of W and Ti silicide.

16. A manufacturing method for a DRAM cell provided with a stacked capacitor formed on a switching transistor having a gate electrode with a source alignment edge, a source region and a drain region formed in a semiconductor substrate having a surface, said method comprising the steps of:
forming a first insulating layer on said semiconductor substrate and over said gate electrode;
depositing a first conductive material on said first insulating layer and selectively etching the deposited conductive material layer to form a saddle pattern over a source region of said switching transistor, said saddle pattern having a middle portion extending over said source region and a saddle end portion ending substantially over said source alignment edge of said gate electrode of said switching transistor;
forming a contact hole in said first conductive material through said middle portion of said saddle pattern to the surface of said semiconductor substrate within the source region of said switching transistor;
depositing a second conductive material on the whole surface of the resultant structure after forming said contact hole and selectively etching the resultant deposited second conductive material layer to form a lower electrode pattern of said stacked capacitor, said second conductive material extending in said contact hole, over said saddle pattern, and beyond said saddle end portion;
coating a dielectric film of said stacked capacitor on the whole surface of said second conductive material; and
depositing a third conductive material on said dielectric film, to form an upper electrode layer of said stacked capacitor.

17. The manufacturing method for a DRAM cell as claimed in claim 16, wherein said dielectric film is composed of one of an oxide layer and an ONO layer.

18. The manufacturing method for a DRAM cell as claimed in claim 16, wherein said first, second and third conductive materials are composed of doped polycrystalline silicon.

19. The manufacturing method for a DRAM cell as claimed in claim 16, further including the steps of:
forming a second insulating layer and a flattening layer upon said upper electrode layer;
forming an opening for exposing a part of said drain region, and
forming a metal silicide layer on both said exposed drain region and on said flattening layer.

20. The manufacturing method for a DRAM cell as claimed in claim 16, wherein said metal silicide layer is composed of one of W and Ti silicide.

* * * * *